(12) United States Patent
Lim et al.

(10) Patent No.: US 6,937,075 B2
(45) Date of Patent: Aug. 30, 2005

(54) METHOD AND APPARATUS FOR REDUCING LOCK TIME IN DUAL CHARGE-PUMP PHASE-LOCKED LOOPS

(75) Inventors: Chee How Lim, Hillsboro, OR (US); Keng L. Wong, Portland, OR (US); Rachael Parker, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/447,697

(22) Filed: May 29, 2003

(65) Prior Publication Data

US 2004/0239386 A1 Dec. 2, 2004

(51) Int. Cl.[7] .................................................. H03L 7/06
(52) U.S. Cl. ........................ 327/157; 327/159; 375/376
(58) Field of Search ................................ 327/144–148, 327/155–157, 189, 162; 375/373–376; 331/DIG. 2, 1 A (56) References Cited

U.S. PATENT DOCUMENTS

| | | | | |
|---|---|---|---|---|
| 5,347,233 A | * | 9/1994 | Ishibashi et al. ................ 331/2 |
| 5,412,349 A | | 5/1995 | Young et al. .................. 331/34 |
| 5,446,867 A | | 8/1995 | Young et al. ................ 713/503 |
| 5,586,307 A | | 12/1996 | Wong et al. ................. 713/400 |
| 5,592,120 A | * | 1/1997 | Palmer et al. .............. 327/536 |
| 5,696,953 A | | 12/1997 | Wong et al. ................. 713/601 |
| 5,708,382 A | * | 1/1998 | Park ............................ 327/277 |
| 6,211,740 B1 | | 4/2001 | Dai et al. ........................ 331/2 |
| 6,320,424 B1 | | 11/2001 | Kurd et al. ..................... 327/8 |
| 6,320,435 B1 | * | 11/2001 | Tanimoto ..................... 327/156 |
| 6,329,882 B1 | | 12/2001 | Fayneh et al. ................ 331/10 |
| 6,407,600 B1 | | 6/2002 | Lu et al. ...................... 327/156 |
| 6,433,596 B1 | * | 8/2002 | Bossard ....................... 327/157 |
| 6,531,974 B1 | | 3/2003 | Callahan et al. ............. 341/144 |
| 6,600,351 B2 | * | 7/2003 | Bisanti et al. ............... 327/157 |

* cited by examiner

*Primary Examiner*—Minh Nguyen
(74) *Attorney, Agent, or Firm*—Schwabe, Williamson & Wyatt, P.C.

(57) ABSTRACT

A phase-locked loop includes a phase detector to measure a phase offset between a reference clock signal and a feedback clock signal, and to generate first and second output control signals having a pulse width corresponding to the phase offset. The phase locked loop further includes a first pulse width control circuit coupled to the phase detector to reduce the pulse width of the first output control signal producing a first modified output control signal, a second pulse width control circuit coupled to the phase detector to reduce the pulse width of the second output control signal producing a second modified output control signal, a first charge pump coupled to the phase detector to provide a first charge signal responsive to the first and second output control signals, and a second charge pump coupled to the first and second pulse width control circuits to provide a second charge signal responsive to the first and second modified output control signals.

19 Claims, 7 Drawing Sheets

METHOD AND APPARATUS FOR REDUCING LOCK TIME IN DUAL CHARGE-PUMP PHASE-LOCKED LOOPS

BACKGROUND OF THE INVENTION

1. Field of the Invention

The present invention relates generally to phase-locked loop circuits, and more specifically, to a design to reduce lock-time in a dual charge-pump phase-locked loop.

2. Background Information

Due to continual advancements in microprocessor design and fabrication techniques, the physical size of microprocessors has been decreased over time, while the clock frequencies of these microprocessors have continually been increased. In order to attain even higher clock frequencies in the future, much attention is currently being focused on increasing clock accuracy by reducing such things as clock skew and jitter, which can adversely affect the timing of a circuit or system.

Figure 1:
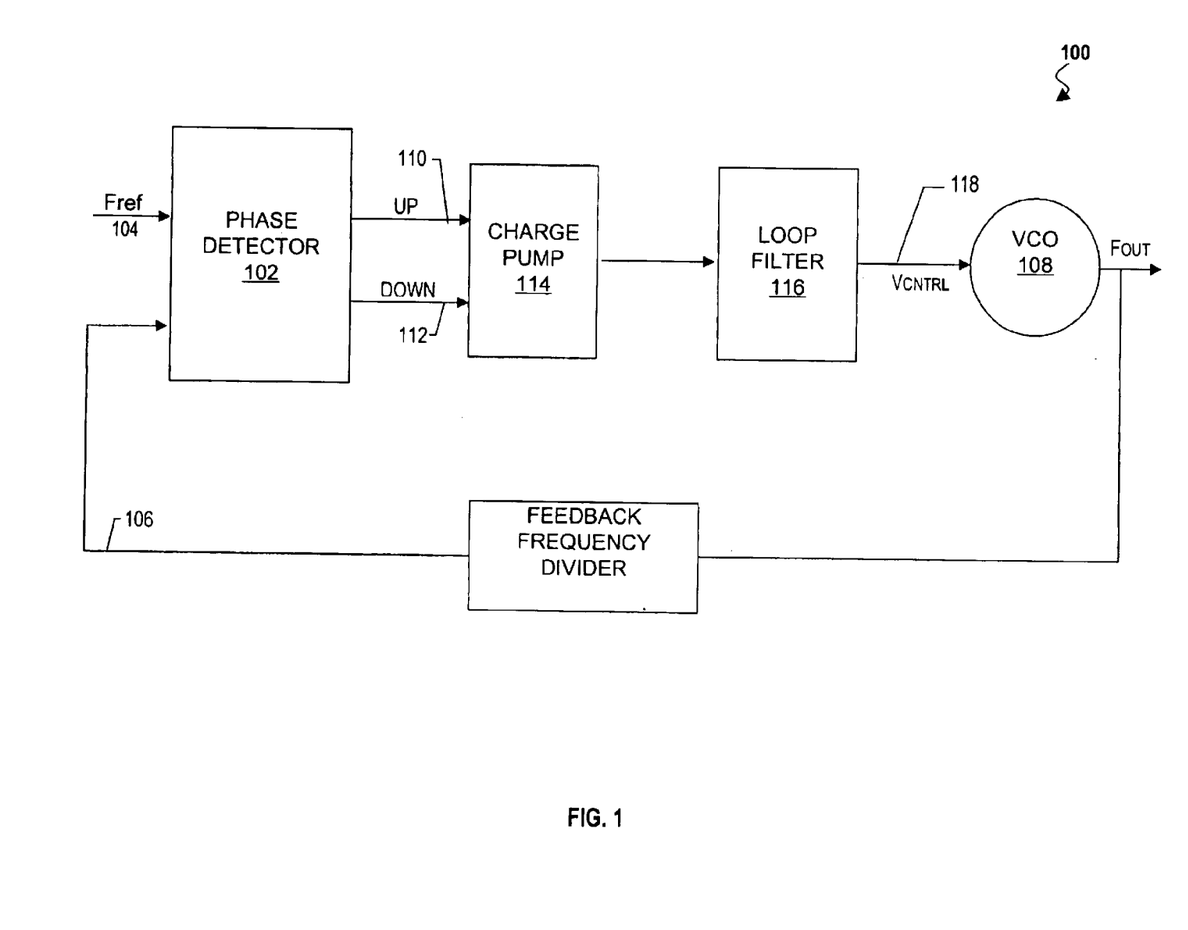
FIG. 1 illustrates a phase-locked loop in accordance with the prior art.

Phase-locked loops or "PLLs" have been widely used in data communications, local area networks, microprocessors, and data storage applications to generate secondary clock signals based upon a given reference signal. FIG. 1 illustrates a phase-locked loop in accordance with the prior art. Conventional PLLs, such as PLL 100, generally include a phase-frequency detector (PFD) 102 for monitoring a phase difference between a reference signal 104 and a feedback signal 106 (in the form of a frequency divided output signal of a voltage-controlled oscillator (VCO) 108). The PFD 102 generates an UP control signal 110 and a DOWN control signal 112 to cause a charge pump 114 to respectively charge and discharge a loop filter 116. The loop control voltage 118 developed across the loop filter 116 determines the output frequency of the VCO 108. Furthermore, the UP and DOWN control signals 110, 112 driving the charge pump 114 set the proper loop filter control voltage 118 at the input of the VCO to maintain a minimal phase error between the input signals applied to the PFD 102.

During lock acquisition, the PFD attempts to correct for frequency differences and/or phase misalignments between the reference and feedback clocks 104, 106. The correction comes in the form of the UP/DOWN control signals 110, 112 whose pulse-widths are proportional to the frequency and/or phase error between the two input signals. The pulse width of the UP/DOWN control signals 110, 112 informs the charge-pump as to how much current to source or sink from loop filter capacitors. As such, a large error causing a large correction is common during the power-up process.

In a PLL containing dual charge-pumps, the primary charge pump adjusts a first control voltage that is associated with a large loop capacitor, and the secondary charge-pump adjusts a second control voltage that realizes a loop resistor. These two control voltages are routed to the VCO to generate an output clock with a frequency that is proportional to the respective control voltages. Since the second control voltage is held by only a small storage capacitor, its voltage ripples tend to be large during lock acquisition as a result of large frequency/phase errors. More specifically, a sufficiently large voltage change can force the VCO out of its linear, functional range resulting in an increased lock time and, in turn, decreased performance.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF EMBODIMENTS OF THE INVENTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternative embodiments. In other instances, well known methods, procedures, components, and circuits have not been described in detail.

Various operations will be described as multiple discrete steps performed in turn in a manner that is helpful for understanding the present invention. However, the order of description should not be construed as to imply that these operations are necessarily performed in the order they are presented, nor even order dependent. Furthermore, repeated usage of the phrase "in one embodiment" does not necessarily refer to the same embodiment, although it may. Lastly, the terms "comprising", "including", "having", and the like, as used in the present application, are intended to be synonymous.

In various embodiments, the present invention facilitates decreased lock time within a PLL having a dual charge-pump arrangement. In one embodiment of the present invention, a first set of unmodified PFD output control signals (e.g. UP/DOWN) are provided directly to a first charge pump, whereas a second set of modified output control signals are provided to a second charge pump. In one embodiment, the modified output control signals are generated via a corresponding set of pulse width control circuits responsive to the unmodified PFD output control signals. In one embodiment, the pulse width control circuits modify the PFD output control signals by reducing the pulse widths of the corresponding control signals.

Figure 2:
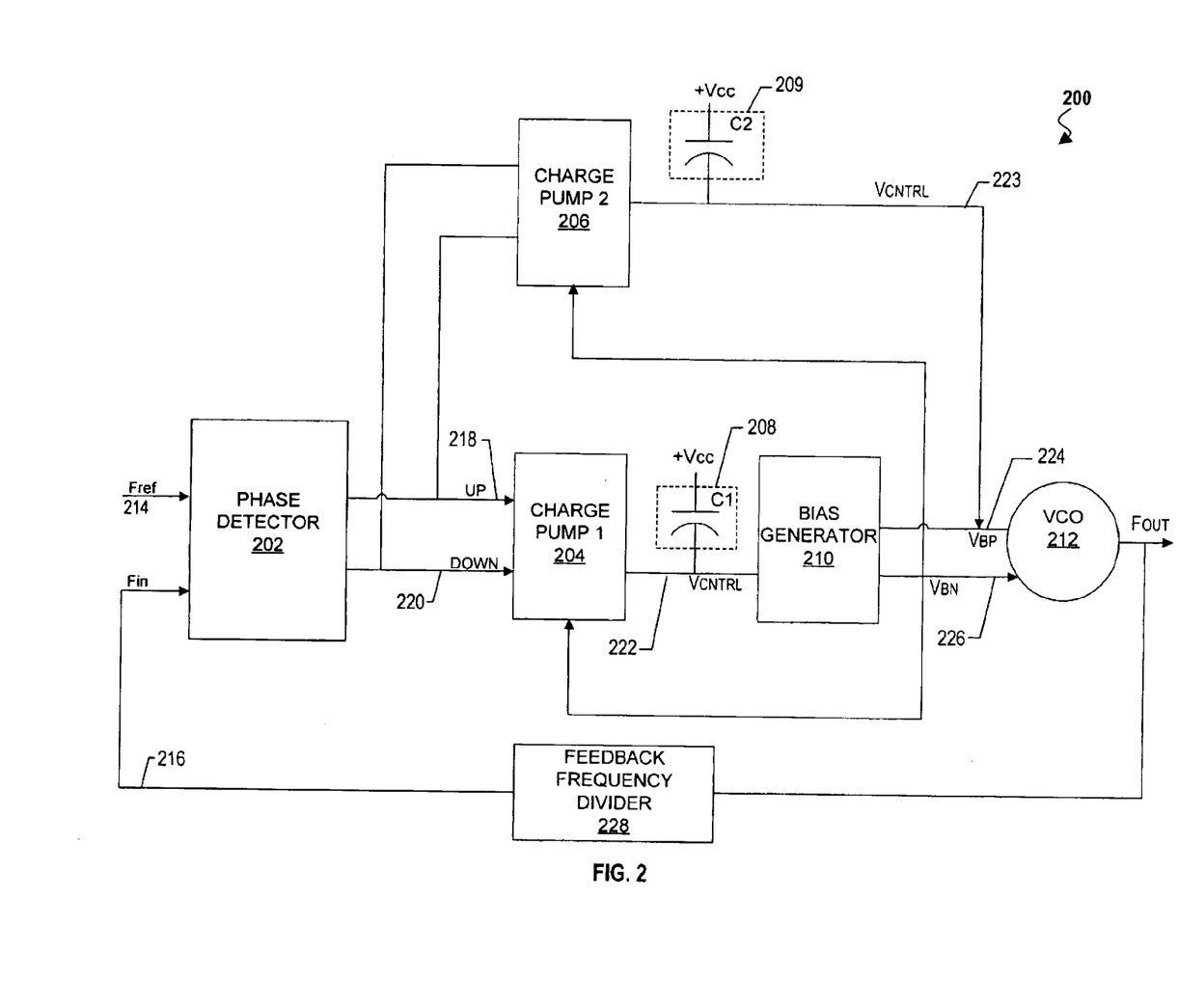
FIG. 2 is a block diagram illustrating a PLL configured in a dual charge pump arrangement.

FIG. 2 is a block diagram illustrating a PLL configured in a dual charge pump arrangement. PLL 200 includes a phase detector 202, charge pumps 204, 206, loop filters 208, 209, a voltage-controlled oscillator (VCO) 212, and a frequency divider 228. The bias generator 210 generates two bias voltages, $V_{BN}$ 226 and $V_{BP}$ 224. $V_{BN}$ 226 controls the VCO 212 and the charge pumps 204, 206 to enable self-biasing while $V_{BP}$ 224 functions as the control voltage of the VCO 212.

The phase detector 202 receives a reference clock signal input $F_{REF}$ 214 and a feedback clock signal input $F_{IN}$ 216, and produces an UP output control signal and a DOWN output control signal on signal lines 218, 220, respectively. The phase detector 202 measures the phase difference between the two input signals 214, 216 and generates a pulse width having a width substantially equal to the amount of phase difference between the signals. The pulse is provided as the UP output control signal on signal line 218 if $F_{REF}$ leads $F_{IN}$, and the pulse is provided as the DOWN output control signal on signal line 220 if $F_{REF}$ lags $F_{IN}$. As shown, signal lines 218, 220 of the phase detector 202 further function as input signal lines to charge pumps 204, 206.

Each charge pump uses the UP control signal as an input signal to produce a negative charge signal (i.e. current pulse) at the charge pumps' respective outputs and each charge pump uses the DOWN control signal to produce a positive charge signal at the charge pumps' respective outputs. The output 222 of the charge pump 204 drives a loop filter 208, and becomes a control line ($V_{CNTL}$) for the bias generator 210. Furthermore, the output signal of the charge pump 206 is coupled to the $V_{BP}$ output 224 from the bias generator 210, and serves as an input signal to the VCO 212.

Each of the loop filters 208 and 209 includes a capacitor (C1, C2) that acts as a low pass filter. One terminal of each of capacitors C1 and C2 is connected to a supply voltage ($V_{CC}$), while the second terminal of capacitor C1 is connected to the output of charge pump 204 and the second terminal of capacitor C2 is connected to the output of charge pump 206. Capacitor C1 in loop filter 208 integrates the current generated by the charge pump 204 to smooth the $V_{CNTL}$ 222, whereas the capacitor C2 in the loop filter 209 integrates the current generated by the charge pump 206 to smooth the $V_{CNTL}$ 223. Loop filter 208 outputs a filtered voltage to the $V_{CNTL}$ 222 input of the bias generator 210. The bias generator 210 receives $V_{CNTL}$ 222 and converts it to the proper bias ($V_{BN}$) 226 for controlling current sources in the VCO 212 and in the charge pumps 204, 206. The bias generator 210 together with the charge pump 206 also generates $V_{BP}$ 224.

In a typical arrangement, capacitor C1 will have an effective capacitance that is approximately an order of magnitude greater than the smaller capacitor C2. For example, capacitor C1 may be a 100 picofarad capacitor, whereas capacitor C2 may be a 10 picofarad capacitor. As was described above, because the capacitance of capacitor C2 is small, corresponding voltage ripples tend to be large during lock acquisition as a result of large phase/frequency errors. As a result, the PLL may be forced out of its linear operating range causing a variety of stability issues within the PLL. In one embodiment of the invention, the phase/frequency corrections associated with a control voltage signal input into the charge pump corresponding to small capacitor C2 (i.e. charge pump 206) is limited as when compared to the phase/frequency corrections associated with a voltage signal input into the charge pump corresponding to the large capacitor C1 (i.e. charge pump 204). In one embodiment, the pulse width of the voltage signal input into charge pump 206 is decreased or chopped in the event a large phase/frequency correction is required by phase detector 202.

Conversely, however, because the capacitance of capacitor C1 is so large, the corresponding control voltage change per charge pump event within charge pump 204 is extremely small (e.g. much smaller than the tolerable ripple), making capacitor C1 naturally immune to the problem mentioned above. More specifically, any decrease in the pulse width of the control voltage signal input into charge pump 204 will require a longer time to move the control voltage sufficiently to achieve frequency and phase lock. Such a long lock time can unnecessarily reduce competitiveness of products incorporating such a PLL, especially when the product engages in power saving modes that involve operational shutdowns. Thus, in accordance with one embodiment of the invention, control voltage signals output from phase detector 202 are provided to charge pump 204 without modification (i.e. directly).

Figure 3:
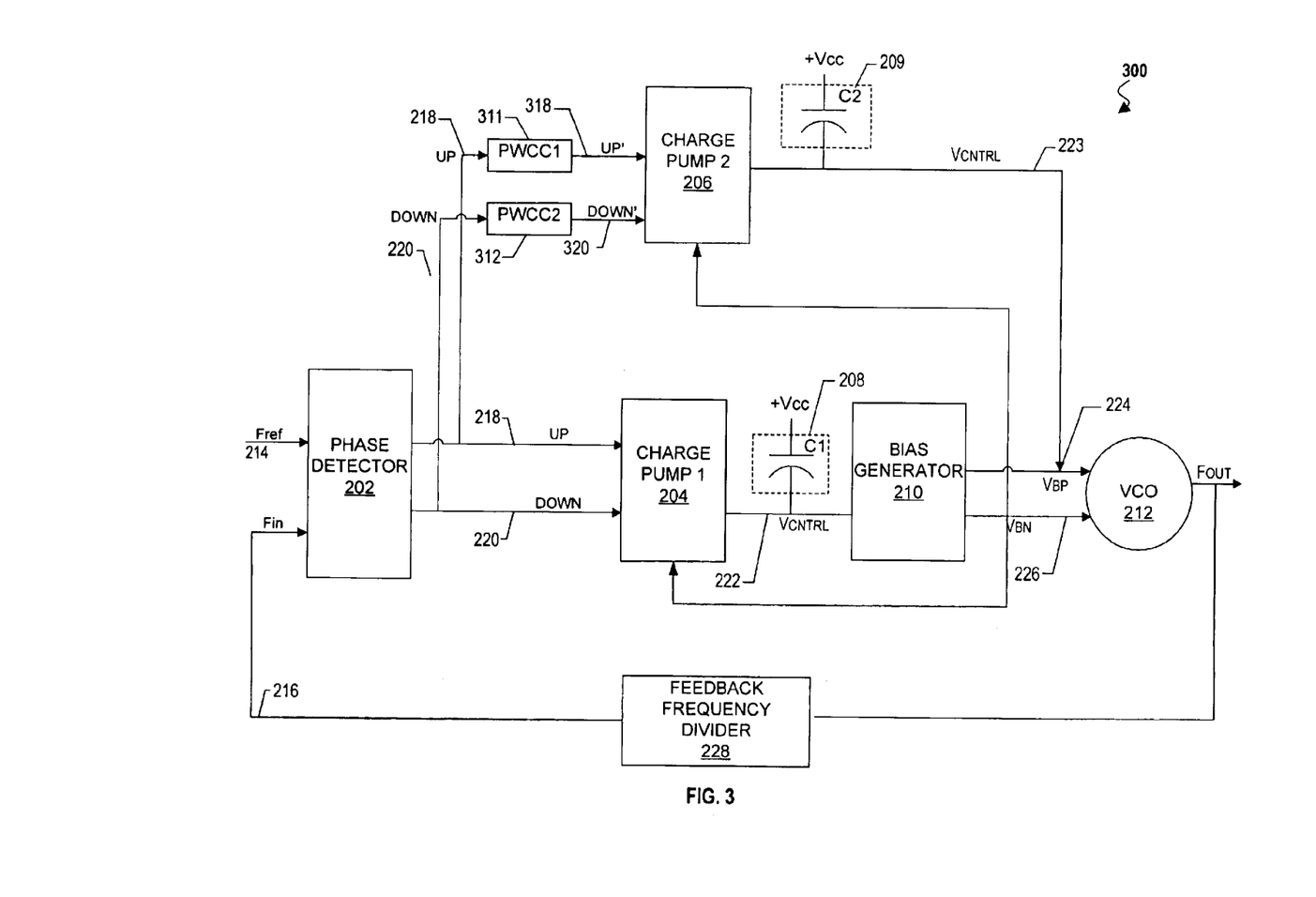
FIG. 3 is a circuit diagram illustrating the dual charge-pump PLL of FIG. 2 equipped with pulse width control circuitry (PWCC) in accordance with one embodiment of the invention.

FIG. 3 is a circuit diagram illustrating the dual charge-pump PLL of FIG. 2 equipped with pulse width control circuitry (PWCC) in accordance with one embodiment of the invention. As described above, phase detector 202 produces an UP output control signal and a DOWN output control signal responsive to input signals $F_{REF}$ 214 and $F_{IN}$ 216, respectively. The UP output control signal is provided to charge pump 204 and a first pulse width control circuit (PWCC) 311 via signal line 218. Similarly, the DOWN output control signal is provided to charge pump 204 and to a second pulse width control circuit (PWCC) 312 via signal line 220.

In accordance with one embodiment of the invention, the pulse width control circuits 311 and 312 operate to produce modified output control signals UP' and DOWN', respectively. In one embodiment of the invention at least one of the pulse width control circuits 311, 312 operate to reduce or at least limit the pulse width of an input signal such as the UP and DOWN output control signals from phase detector 202. In one embodiment, at least one of the pulse width control circuits 311, 312 functions as a "pulse-chopper" producing a modified output control signal (e.g., UP', DOWN') having a pulse width corresponding to an amount of delay that is injected into the input signal by the respective pulse width control circuit 311, 312.

Figure 4:
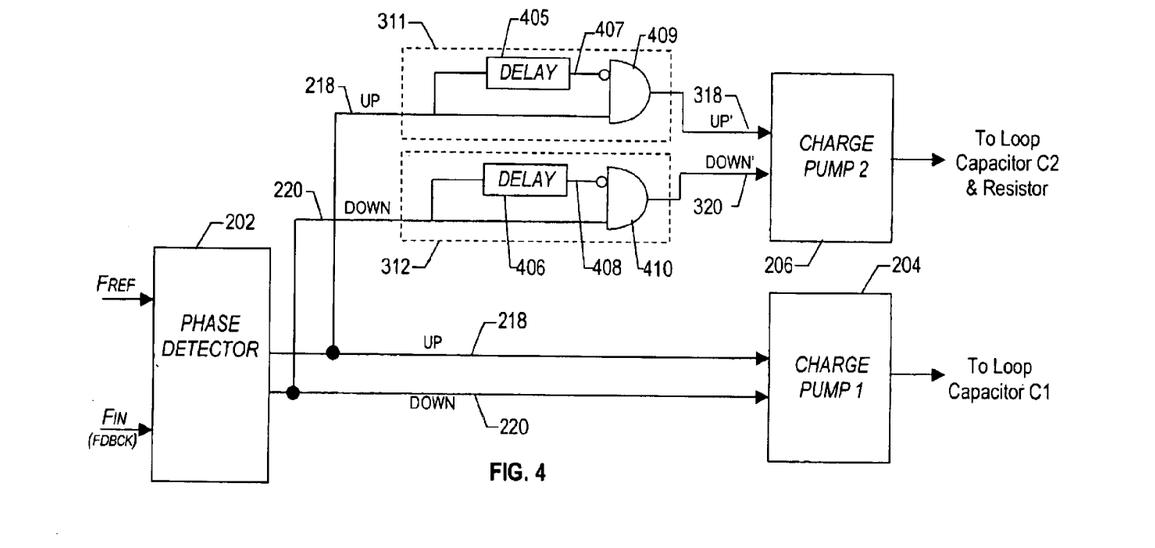
FIG. 4 illustrates PLL circuitry including two pulse width control circuits configured in accordance with one embodiment of the invention.

FIG. 4 illustrates PLL circuitry including a more detailed view of two pulse width control circuits configured in accordance with one embodiment of the invention. As shown, PWCC 311 is coupled to the phase detector 202 via signal line 218, and to charge pump 206 via signal line 318. Similarly, PWCC 312 is coupled to the phase detector 202 via signal line 220 and to charge pump 206 via signal line 320. In accordance with the illustrated embodiment, each of pulse width control circuits 311 and 312 include one or more combinational logic elements such as logical AND gates 409, 410 coupled to inverting delay circuits 405, 406. In one embodiment, the UP output control signal and the DOWN output control signal produced by the phase detector 202 are input into PWCC 311 and PWCC 312, respectively. More specifically, in one embodiment an output control signal pulse from phase detector 202 is input directly into AND gate 409/410 via signal line 218/220, whereas the same pulse is input into logical AND gates 409/410 via signal line 407/408 only after passing through delay circuits 405/406. Thus, in the illustrated embodiment logical AND gates 409 and 410 operate in conjunction with delay circuits 405 and 406 to produce modified (UP' or DOWN') output control pulses having reduce the pulse widths. However, in other embodiments similar combinational logic/delay element combinations may be utilized to perform the pulse width modifications in accordance with the teachings of the present invention.

Figure 5:
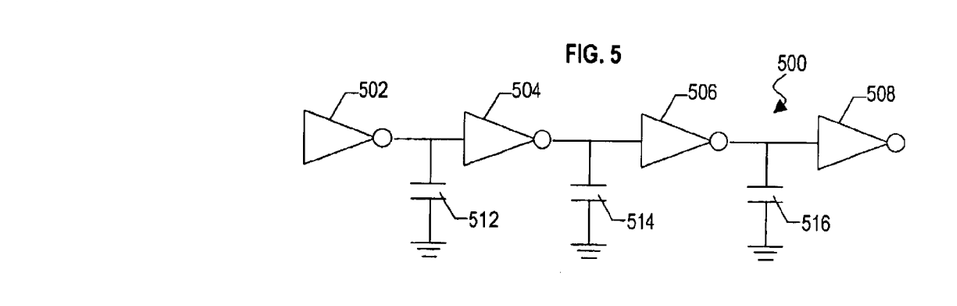
FIG. 5 illustrates an example delay circuit in accordance with one embodiment of the present invention.

FIG. 5 illustrates one embodiment of a delay circuit, such as delay circuits 405, 406 of the present invention. As shown, the delay circuit 500 represents a series of inverters and capacitors coupled together in a series of cascaded buffers. The first inverter 502 may be coupled to a second inverter 504 that is coupled to a third inverter 506 that is, in turn, coupled to a fourth inverter 508. The respective capacitors 512, 514 and 516 may be coupled between each of the inverters and ground as shown in FIG. 5. Stated differently, the delay circuit 500 may be achieved by a series of inverter gate delays followed by capacitors coupled to ground. The first inverter 502 may receive either the output control signal on signal line 218 or 220, with each stage of the delay circuit 500 delaying the signal by a gate delay proportional to the capacitance of the next stage. The number of stages in the delay circuit 500 can be altered depending on the desired delay. In one embodiment, the modified output control signal pulse is limited by the delay generated by the delay circuits 405 and 406.

Figure 6:
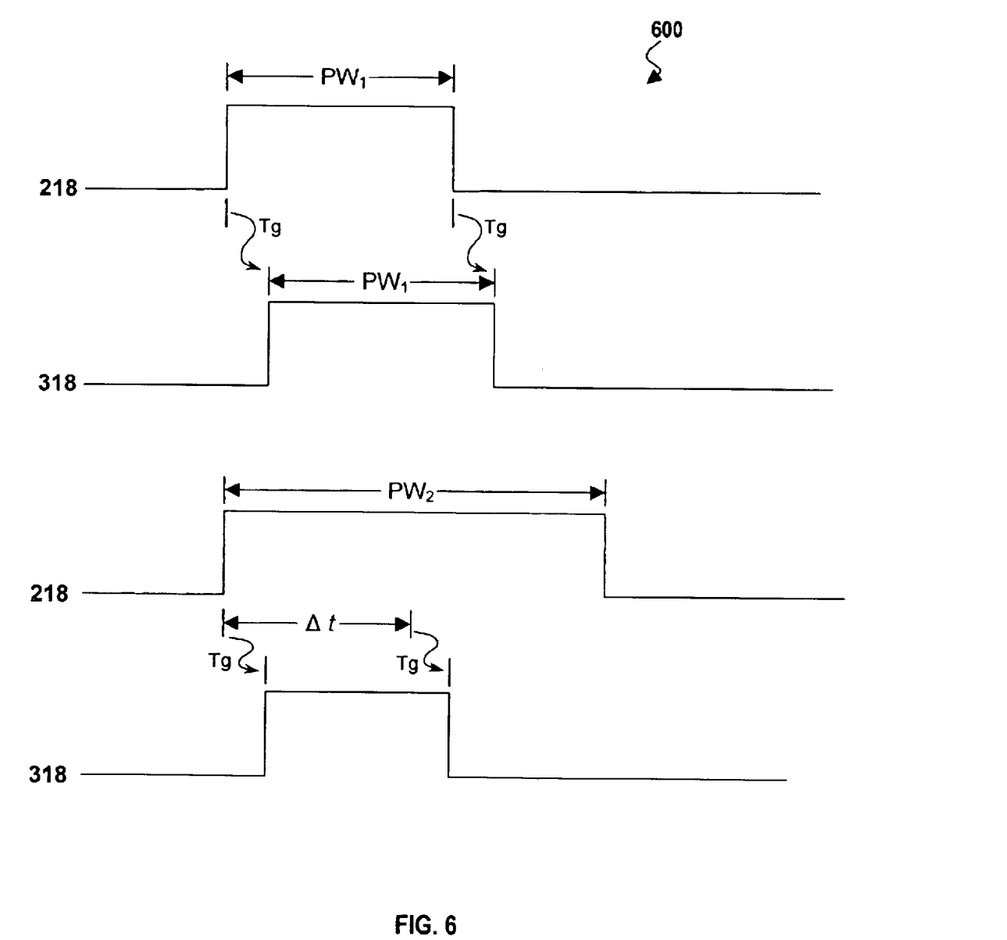
FIG. 6 is a timing diagram illustrating a pulse signal traversing one embodiment of a width control circuit.

FIG. 6 is a timing diagram illustrating a pulse signal traversing one embodiment of a width control circuit of the present invention. As a pulse having a relatively small pulse width "PW1" is provided to pulse width control circuit 311 on signal line 218 for example, the pulse passes directly through AND gate 409 to signal line 318 after being subjected to a minimal gate delay (Tg). However, if a second large pulse having a pulse width "PW2" is provided to pulse width control circuit 311 on signal line 218 for example, the pulse width will be limited by the delay (delta T) injected by the delay circuit 405.

Figure 7:
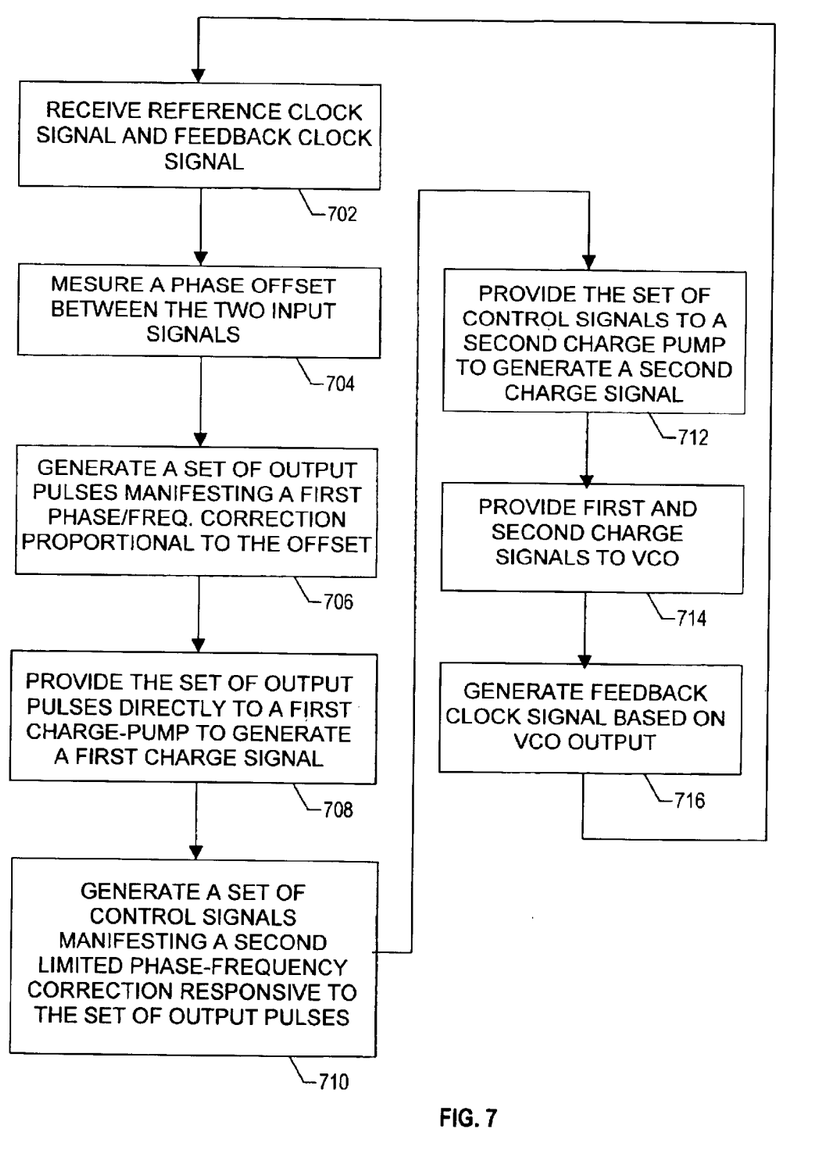
FIG. 7 illustrates an operational flow of one example embodiment of the present invention.

FIG. 7 illustrates an operational flow of one example embodiment of the present invention. As shown, in block 702, the phase frequency detector 202 receives the reference clock signal 214 and the feedback clock signal 216. In block 704, the phase frequency detector 202 measures the phase offset between the two input signals and generates a set of output pulses (e.g. UP, DOWN) manifesting a first phase/frequency correction proportional to the offset in block 706. The output pulses are subsequently provided without modification to a first charge pump 204 via signal lines 218, 220 (block 708). In block 710, a set of control signals manifesting a second limited phase-frequency correction are generated responsive to the set of output pulses. In block 712, the set of control signals are provided to a second charge pump 206 to generate a second charge signal. In block 714, the first and second charge signals are provided to the VCO 212 to generate the feedback clock signal 216 based upon the VCO output, in block 716.

Figure 8:
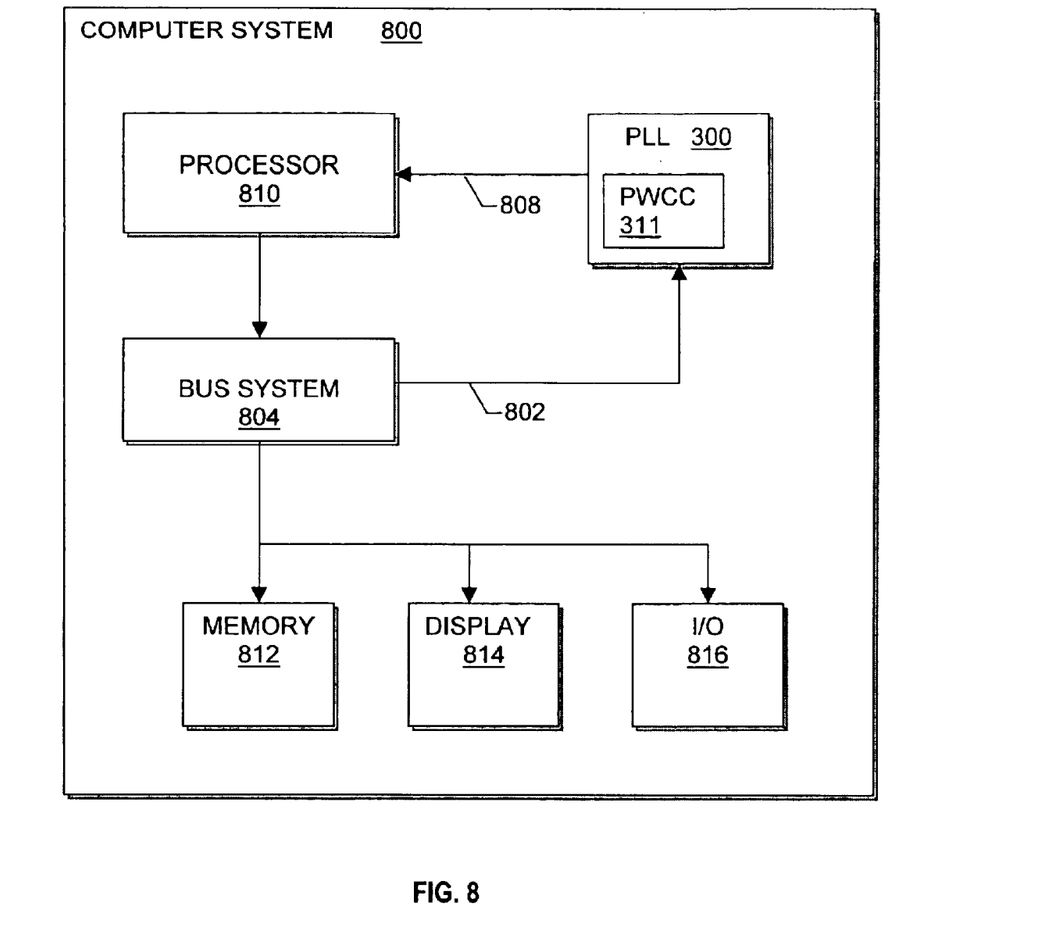
FIG. 8 illustrates is a block diagram of a computer system having a dual charge-pump PLL incorporated with the pulse width correction circuitry of the present invention.

FIG. 8 illustrates is a block diagram of a computer system 800 having a dual charge-pump PLL incorporated with the pulse width correction circuitry of the present invention. As shown, the computer system 800 includes a processor 810, a PLL 300 incorporating pulse-width control circuit 311, input/output devices 816, a display device/interface 814, and system memory 812 coupled to each other via bus system 804. System memory 812 may represent a wide variety of memory types known in the art including both volatile memory devices such as RAM, DRAM, SDRAM and so forth, and nonvolatile memory devices such as ROM, EEPROM, Flash and the like.

In one embodiment, the dual charge-pump PLL 300 receives a bus clock 802 from the bus system 804. A phase detector (not shown) in the PLL 300 compares the bus clock signal 802 with a feedback frequency from a VCO (not shown), and pulse width correction circuitry 311 limits the pulse width of the input into one of the charge pumps. Furthermore, the feedback frequency locks the output of the VCO to the multiple frequency of the bus clock 802. In turn, the output 808 of the PLL 300 is used as a clock source for processor 810. The processor 810 is then able to interface with other components of the computer system 800, such as memory 812, display 814, and I/O devices 816. In other embodiments, the PLL 300 or one or more other PLLs incorporating pulse-width control circuit 311 may be included within one or more components of computer system 800.

In accordance with one embodiment of the invention, synchronized clocks in the processor 810 and the bus system 804 enable data in the processor 810, the memory 812, the display 814 and the I/O devices 816 to be transferred and shared across the bus system 804 with minimal data latency or data loss.

EPILOG

While the present invention has been described in terms of the above-illustrated embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. A method comprising:

measuring a phase offset between a reference clock signal and a feedback clock signal;

generating first and second output control signals having a pulse width corresponding to the phase offset;

providing the first and second output control signals to a first charge pump;

generating a modified output control signals corresponding to the first output control signal having a reduced pulse width, said generating being at least partially performed with a combinatorial logic gate having a plurality of input terminals, the plurality of input terminals each being adapted to receive the first output control signal; and providing the modified output control signals to a second charge pump.

2. The method of claim 1, wherein the first output control signal is provided to a first pulse width control circuit when the reference clock signal leads the feedback clock signal.

3. The method of claim 2, wherein the second output control signal is provided to a second pulse width control circuit when the reference clock signal lags the feedback clock signal.

4. The method of claim 1, wherein the reduced pulse width is limited by an amount with which the first and second output controls signals are delayed.

5. A phase-locked loop circuit comprising:

a phase detector to measure a phase offset between a reference clock signal and a feedback clock signal, and to generate first and second output control signals having a pulse width corresponding to the phase offset;

a first charge pump coupled to the phase detector to provide a first charge signal responsive to the first and second output control signals;

a first pulse width control circuit coupled to the phase detector to produce, responsive to the first output control signal, a first modified output control signal corresponding to the first output control signal having a reduced pulse width, the first pulse width control circuit including a first delay circuit to receive the first output control signal;

a first loop filter capacitor having a first capacitance coupled to an output of the first charge pump;

a second charge pump coupled to the first pulse width control circuit to provide a second charge signal responsive to the first modified output control signal; and a second loop filter capacitor having a second capacitance coupled to an output of the second charge pump.

6. The phase-locked loop circuit of claim 5, wherein the first capacitance is at least one order of magnitude greater than the second capacitance.

7. A system comprising:

a processor;

a memory configured to store data;

a bus coupled to the processor and memory to facilitate data exchange between the processor and memory; and a phase-locked loop coupled to the processor and the bus to provide one or more clock signals to facilitate data synchronization, the phase-locked loop including a phase detector to measure a phase offset between a reference clock signal and a feedback clock signal, and to generate first and second output control signals having a pulse width corresponding to the phase offset;

a first charge pump coupled to the phase detector to provide a first charge signal responsive to the first and second output control signal;

a first loop filter capacitor having a first capacitance coupled to an output of the first charge pump;

a first pulse width control circuit coupled to the phase detector to produce, responsive to the first output control signal, a first modified output control signal corresponding to the first output control signal having a reduced pulse width, the first pulse width control circuit including a first delay circuit to receive the first output control signal;

a second charge pump coupled to the first pulse width, control circuit to provide a second charge signal responsive to the first modified output control signal; and a second loop filter capacitance coupled to an output of the second charge pump.

8. The system of claim 7, wherein the first capacitance is at least one order of magnitude greater than the second capacitance.

9. The system of claim 7, wherein the phase-locked loop further comprises one or more combinational logic elements coupled to the first delay circuit and the phase detector.

10. The system of claim 7, wherein the phase-locked loop further comprises:

a second pulse width control circuit coupled to the phase detector to produce, responsive to the second output control signal, a second modified output control signal corresponding to the second output control signal having a reduced pulse width, the second pulse width control circuit including a second delay circuit to receive the second output control signal;

wherein the second charge pump is further coupled to the second pulse width control circuit to provide the second charge signal responsive to either the first or the second modified output control signals.

11. A phase-locked loop circuit comprising:

a phase detector to measure a phase offset between a reference clock signal and a feedback clock signal, and to generate first and second output control signals having a pulse width corresponding to the phase offset;

a first charge pump coupled to the phase detector to provide a first charge signal responsive to the first and second output control signals;

a first pulse width control circuit coupled to the phase detector to produce, responsive to the first output control signal, a first modified output control signal corresponding to the first output control signal having a reduced pulse width, the first pulse width control circuit including a combinatorial logic gate having a plurality of input terminals, wherein each of the input terminals are coupled to the phase detector to receive the first output control signal from the phase detector; and a second charge pump coupled to the first pulse width control circuit to provide a second charge signal responsive to the first modified output control signal.

12. The phase-locked loop circuit of claim 11, wherein the combinatorial logic gate comprises a logical AND gate.

13. The phase-locked loop circuit of claim 12, wherein the first pulse width control circuit further includes a delay circuit coupled between the phase detector and a subset of the plurality of input terminals of the logical AND gate.

14. The phase-locked loop circuit of claim 13, wherein the delay circuit comprises an inverting logic stage.

15. The phase-locked loop circuit of claim 13, wherein the first pulse width control circuit further includes an inverting logic stage coupled between the delay circuit and the logical AND gate.

16. A system comprising:

a processor;

a memory configured to store data;

a bus coupled to the processor and memory to facilitate data exchange between the processor and memory; and a phase-locked loop coupled to the processor and the bus to provide one or more clock signals to facilitate data synchronization, the phase-locked loop including a phase detector to measure a phase offset between a reference clock signal and a feedback clock signal, and to generate first and second output control signals having a pulse width corresponding to the phase offset;

a first charge pump coupled to the phase detector to provide a first charge signal responsive to the first and second output control signals;

a first pulse width control circuit coupled to the phase detector to produce, responsive to the first output control signal, a first modified output control signal corresponding to the first output control signal having a reduced pulse width, the first pulse width control circuit including a combinatorial logic gate having a plurality of input terminals, wherein each of the input terminals are coupled to the phase detector to receive the first output control signal from the phase detector; and a second charge pump coupled to the first pulse width control circuit to provide a second charge signal responsive to the first modified output control signal.

17. The system of claim 16, wherein the phase-locked loop further comprises:

a second pulse width control circuit coupled to the phase detector such that the second output control signal is provided to the second pulse width control circuit when the reference clock signal lags the feedback clock signal.

18. The system of claim 16, wherein the combinatorial logic gate comprises a logical AND gate.

19. The phase-locked loop circuit of claim 18, wherein the first pulse width control circuit further includes a delay circuit coupled between the phase detector and a subset of the plurality of input terminals of the logical AND gate.

* * * * *

UNITED STATES PATENT AND TRADEMARK OFFICE
CERTIFICATE OF CORRECTION

PATENT NO. : 6,937,075 B2
APPLICATION NO. : 10/447697
DATED : August 30, 2005
INVENTOR(S) : Lim et al.

It is certified that error appears in the above-identified patent and that said Letters Patent is hereby corrected as shown below:

Col. 6, line 34, "...control signals." should read --...control signal.--;
Col. 6, line 52, "...controls signals." should read --...control signals.--; and
Col. 7, lines 35-36, "...pulse width, control circuit." should read --...pulse width control circuit.--.

Signed and Sealed this

Nineteenth Day of September, 2006

JON W. DUDAS
*Director of the United States Patent and Trademark Office*